United States Patent
Tian et al.

(10) Patent No.: US 6,919,645 B2
(45) Date of Patent: Jul. 19, 2005

(54) DIE PACKAGE

(75) Inventors: Edmund Lua Koon Tian, Singapore (SG); Lim Thiam Chyc, Singapore (SG)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/785,448

(22) Filed: Feb. 24, 2004

(65) Prior Publication Data

US 2004/0164410 A1 Aug. 26, 2004

Related U.S. Application Data

(62) Division of application No. 10/118,570, filed on Apr. 8, 2002, now Pat. No. 6,825,572.

(30) Foreign Application Priority Data

Dec. 8, 2001 (SG) .......................................... 200107630

(51) Int. Cl.⁷ .............................................. H01L 23/28
(52) U.S. Cl. ........................ 257/787; 257/678; 257/684; 257/704; 438/112; 438/127
(58) Field of Search ................................. 257/787, 678, 257/684, 685, 686, 687; 438/112, 124, 127, 106, 121, 109, 125, 118, 126, 617

(56) References Cited

U.S. PATENT DOCUMENTS

| | | | | |
|---|---|---|---|---|
| 5,592,025 A | | 1/1997 | Clark et al. ................. | 257/774 |
| 5,625,222 A | * | 4/1997 | Yoneda et al. ............... | 257/687 |
| 5,990,545 A | | 11/1999 | Schueller et al. ........... | 257/697 |
| 6,084,311 A | | 7/2000 | Jiang et al. .................. | 257/782 |
| 6,111,306 A | * | 8/2000 | Kawahara et al. .......... | 257/666 |
| 6,124,637 A | * | 9/2000 | Freyman et al. ............ | 257/736 |
| 6,150,193 A | | 11/2000 | Glenn ........................ | 438/113 |
| 6,228,676 B1 | | 5/2001 | Glenn et al. ................. | 438/107 |
| 6,235,862 B1 | | 5/2001 | Isshiki et al. ................. | 528/15 |
| 6,300,687 B1 | | 10/2001 | Bertin et al. ................. | 257/784 |
| 6,310,390 B1 | | 10/2001 | Moden | |
| 6,492,717 B1 | | 12/2002 | Gore et al. .................. | 257/679 |
| 6,531,784 B1 | | 3/2003 | Shim et al. .................. | 257/777 |
| 6,564,454 B1 | | 5/2003 | Glenn et al. .................. | 29/852 |
| 2002/0009766 A1 | | 1/2002 | Chen et al. .................. | 257/738 |

* cited by examiner

Primary Examiner—David Nelms
Assistant Examiner—Long Tran
(74) Attorney, Agent, or Firm—Schwegman, Lundberg, Woessner & Kluth, P.A.

(57) ABSTRACT

Methods and structures for die packages are described. The die package includes an integrated circuit die connected to and elevated above a substrate. In an embodiment, wire bonds connects pads on the die to pads on the substrate. The substrate pads are closely adjacent the die due to the die support being positioned inwardly of the peripheral surface of the die. In an embodiment, the die support includes a paste that flows outwardly when connecting the die to the substrate. The outward paste flow extends from beneath the die support but does not extend outwardly of the die so as to not interfere or contact the substrate pads.

32 Claims, 8 Drawing Sheets

DIE PACKAGE

This application is a Divisional of U.S. application Ser. No. 10/118,570, filed Apr. 8, 2002 now U.S. Pat. No. 6,825,572, which claims priority under 35 U.S.C. 119 from Singapore Application No. 200107630-6 filed Dec. 8, 2001, both of which are incorporated herein by reference.

TECHNICAL FIELD

The present invention relates generally to circuit packaging, and in particular to apparatus and methods for packaging integrated circuits.

BACKGROUND

Integrated circuits are formed in dies on wafers. The dies are diced into individual die that are packaged to protect the die. A die package provides protection of the die from environmental factors, electrical and physical connection to circuits, and heat dispersion from the die.

FIG. 1 shows a conventional die package 100. Package 100 includes a die 105 and attachment paste 107 physically connecting the die to a substrate 110. The paste 107, when applied or when the die is pressed onto the paste, bleeds out from underneath the die 105. A plurality of wire bonds 112 electrically connect the die to pads 114 on the substrate 110. Substrate pads 114 are positioned outwardly of the die 105 and the paste 107. Thus, the substrate has a greater surface area than the die. The substrate pads 114 are, through vias 116, electrically connected to solder balls 120. Solder balls 120 are adapted to electrically connect to circuits outside the package 100. An encapsulant 125 covers the top and sides of die 105. The encapsulant 125 and the substrate 110 define a substantially cube-shaped structure. Accordingly, the encapsulant 125 extends outwardly from the die 105 a sufficient distance 130 to cover the wire bonds 112 and substrate pads 114. Typically the distance 130 is over 1.00 millimeters. In one conventional package 100, the distance is 1.25, which adds 2.5 millimeters to the width of the package 100 due to the distance 130 being on left and right sides of the die 105 as shown in FIG. 1. One current technique has reduced the distance 130 to 1.0 millimeter. It is desired to reduce the distance the encapsulant extends outwardly of the die to provide a narrow package or allow the packaging of larger die.

For the reasons stated above, for other reasons stated below, and for other reasons which will become apparent to those skilled in the art upon reading and understanding the present specification, there is a need in the art for an improved electronic component package and methods of packaging electronic components.

SUMMARY

The present invention is directed to an integrated circuit die package. An embodiment of the present invention includes connecting a die to a substrate to form a package, wherein the connecting material remains under the die. In an embodiment, the connecting material covers a smaller area of the substrate than the area that the die covers. This allows substrate contacts to be moved inwardly from the outer edge of the substrate without being contacted or fouled by the connecting material. In an embodiment, the connecting material includes an adhesive layer. In an embodiment, the connecting material includes an adhesive tape. In an embodiment, the connecting material includes a paste layer. An embodiment of the paste layer bleeds out from under the element that contacts the paste layer. Consequently, in this embodiment, a spacer that is smaller in area than the die is provided and contacts the paste layer so that the paste layer does not extend outwardly of the die. In an embodiment, the connecting structure includes an adhesive layer connected to the die, a spacer connected to the adhesive layer, and a paste affixing the spacer to the substrate. In an embodiment, the spacer is smaller than the die, thus a void extends around the spacer between the die and substrate. Any paste bleed out from beneath the spacer remains in the void.

The present invention also includes a package including a die that is elevated from the substrate to which the die is attached. In an embodiment, the die is elevated by only an adhesive layer. In an embodiment, the die is elevated by a support assembly that also affixes the die to the substrate.

The present invention also includes methods for packaging integrated circuit dies. An embodiment of the present invention includes keeping any connection material beneath the die. Thus, the substrate contacts can be moved inwardly closer to the die. In an embodiment, the connection material includes a paste. In an embodiment, the connection material is an adhesive layer. Other methods will be apparent from reading the disclosure.

The present invention also includes electrical devices, memory units, memory modules, electrical systems, computers, which include a package according to the present invention.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE EMBODIMENTS

In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and their equivalents.

Figure 2:
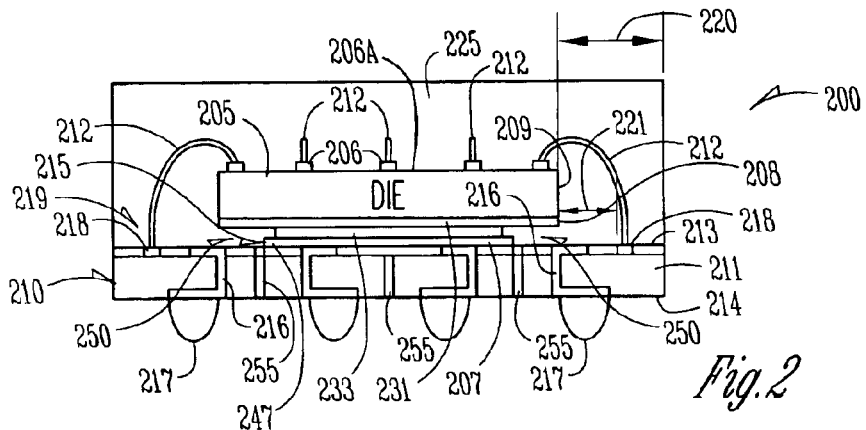
FIG. 2 is an elevational view of a package according to the present invention.
Figure 3:
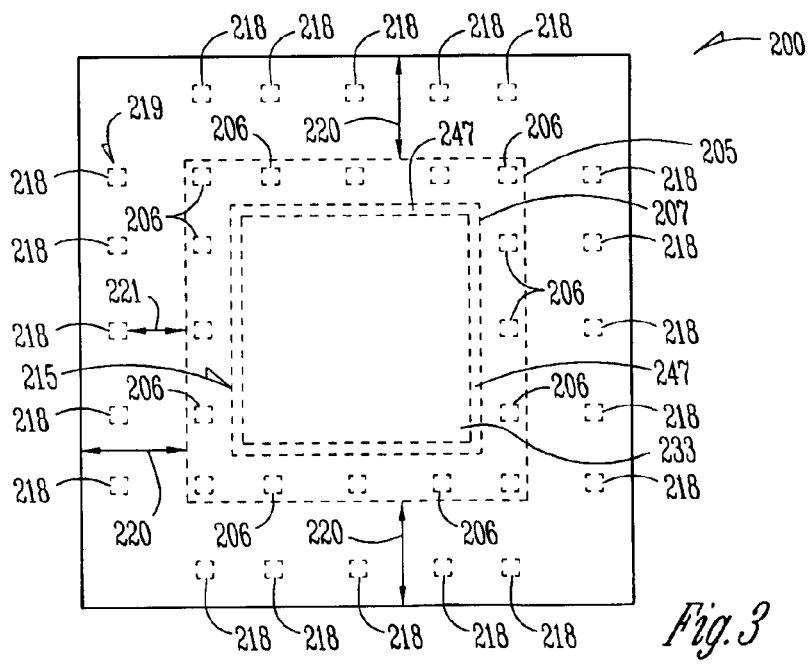
FIG. 3 is a top, plan view of package shown in FIG. 2.

FIGS. 2 and 3 show a die package 200 according to the teachings of the present invention. Package 200 includes a die 205, a substrate assembly 210, a connection, support assembly 215 physically connecting the die to the substrate assembly 210, and at least one wire bond 212 electrically connecting the die 205 to the substrate assembly 210. Die 205 is an individual pattern, typically rectangular in area and a rectangular parallelepiped in volume, on a substrate or wafer that contains circuitry, or integrated circuit devices, to perform a specific function. Accordingly, die 205 includes a top surface 206a, a bottom surface 208, and a peripheral side surface 209 extending between the top and bottom surfaces. One of skill in the art will appreciate that die 205 is one portion or pattern on a wafer or substrate. Such wafers include, but are not limited to, semiconductor wafers. The wafer having the integrated circuit may further include semiconductor structures during processing and other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of the referred to element of the package, regardless of its orientation. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the package and elements thereof, regardless of the orientation of the package or element. Moreover, terms "in" and "out" refer to the geometric center of the referred element. These definitions extend to terms of similar meaning.

Die 205 includes an electrical circuit fabricated (not shown) thereon according to known techniques. Die 205 includes integrated circuit elements such as capacitors, transistors, line, interconnects, plugs, pads, traces, I/O connections, insulators, and/or other elements known in the art. These integrated circuit elements form electronic components such as processors, ASICs, memory controllers, and memory devices. Examples of memory devices include DRAM, SRAM, SDRAM, EEPROM, flash memory, ROM, etc. Die 205 includes at least one bonding pad 206 to which one end of bonding wire 212 is connected. In an embodiment, pads 206 are at the top layer of the die. In an embodiment of the invention, die 205 includes a plurality of bonding pads 206. In an embodiment, the pads 206 are on the side 209 of the die. In an embodiment, the pads 206 are center bond pads. It will be recognized that the pads 206 are not limited to the positions described herein, and, in other embodiments, may be alternately positioned.

Figure 1:
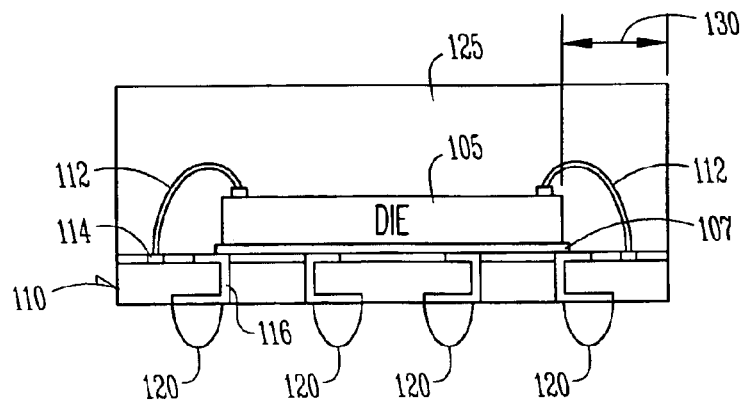
FIG. 1 is an elevational view of a conventional package.

Substrate assembly 210 includes a substrate base 211 having a top surface 213 and a bottom surface 214. The substrate base 211, in an embodiment, includes a flexible polymide material. In an embodiment, the substrate base 211 is an organic material. In an embodiment, the substrate base 211 is a resin. In an embodiment, the substrate base 211 includes a glass. In an embodiment, the substrate base 211 includes an epoxy. In an embodiment, the substrate base 211 includes glass and epoxy. Thermal vias 255 extend through the substrate base 211. Thermal vias 255 assist in cooling the die 205 during its operation. Interconnect vias 216 also extend through the substrate base 211. At least one conductive contact is 217 is positioned on the substrate bottom surface 214. In an embodiment, a plurality of contacts 217 are provided. The contacts 217, in an embodiment, are ball contacts. The contacts 217, in an embodiment, are a land grid array. Contacts 217, in an embodiment, are metal. Contacts 217, in an embodiment, are plastic. The contacts 217 are electrically and physically connected to the interconnect vias 216. At least one bonding wire contact 218 is positioned on the substrate top surface 213. In an embodiment, a plurality of contacts 218 are on the substrate top surface 213. Contacts 218 are positioned on an outer portion 219 of the substrate. In an embodiment, the outer portion 219 extends around the periphery of the substrate top surface and outwardly of the die 205 and support assembly 215. In an embodiment, the outer portion 219 has a width 220 of less than 1.0 millimeter. In an embodiment, the outer portion width 220 is less than about 0.7 millimeter. In an embodiment, the outer portion width 220 of less than about 0.6 millimeter. In an embodiment, the outer portion width 220 of less than about 0.5 millimeter. With these widths, the contacts 218 are closer to the outer edge surface 209 of the die 205 than conventional packages such as shown in FIG. 1.

Support assembly 215 includes an adhesive film 231 affixed to the die bottom surface 208 and a spacer 233. The adhesive film 231 fixes the die to the spacer 233. In an embodiment, the adhesive layer 231 is not flowable. In an embodiment, the adhesive layer 231 is a double sided adhesive tape. In the FIGS. 2 and 3 embodiment, the adhesive film 231 has a top surface area essentially equal to the surface area of the die bottom surface 208. Accordingly, the peripheral edge of the adhesive film 231 is essentially coplanar the respective outer surfaces 209 of the die 205. In the FIGS. 2 and 3 embodiment, the spacer 233 has a top surface area that is less than the surface area of the die bottom surface 208. Moreover, the spacer 233 has a top surface area that is less than the surface area of the adhesive film 231. Accordingly, the spacer 233 is recessed beneath the die 205 and adhesive film 231. That is, the die 205 overhangs the spacer 233. The spacer 233, in an embodiment, is an insulator. The spacer 233, in an embodiment, includes silicon. The spacer 233, in an embodiment, is silicon. In an embodiment, the spacer 233 includes any type of material that elevates the die 205 in the Z-axis (the plane of upper surface of the substrate assembly 210 defining the X-Y plane). Other examples of materials for the spacer 233 include metal, alloys, plastics, polymers. It will be recognized that the spacer 233 must adequately and essentially permanently fixedly adhere to the die 205 through adhesive film 231 and to substrate assembly 210 through paste layer 207 as described herein. In an embodiment, the spacer 233 is rigid and a rectangular parallelepiped having a height less than its top surface area to provide a minimum separation between the die 205 and the substrate assembly 210 while providing adequate connection to the die and substrate. Thus, the upper and power surfaces of the spacer 233 are, in an embodiment, parallel to the lower surface of the die 205 and the upper surface of the substrate assembly 210.

Support assembly 215 further includes a paste layer 207, which is intermediate the substrate assembly 210 and the spacer 233. The paste layer 207 adheres the spacer 233 to the top surface 213 of the substrate 210. In operation, the material of the paste layer 207 is applied to the top surface 213 of the substrate. In an embodiment, paste layer 207 covers an area of the substrate top surface 213 generally equal to the bottom surface of the spacer 233. This provides a complete coverage of the bottom surface of the spacer 233 to provide an adequate bond between the spacer 233 and substrate 210. The spacer 233, which is adhered to the die 205 by adhesive film 231, is brought into contact with the paste layer 207. In an embodiment, the spacer and die assembly 233 and 205 is pressed into the paste layer 207. The material of the paste layer 207 is flowable. Accordingly, an amount 247 of the paste layer bleeds out from under the spacer 233. The amount 247 is insignificant enough so as to not degrade the adhesion of spacer 233 to substrate assembly 210 to such a point where the adhesion fails. However, the bleed-out amount 247 does require that the substrate, top surface contacts 218 be positioned a minimum distance from the paste material to prevent the bleed-out amount 247 from contacting the contacts 218. In the embodiment shown in FIGS. 2 and 3, the bleed-out amount 247 remains under the die 205. Accordingly, the outer edge of the die 205 is closer to the outer edge of the substrate assembly 210 and the substrate contacts 218 than in conventional packages.

The amount of paste bleed-out 247 is difficult to control at the level of precision required when packaging integrated circuit dies. The paste bleed-out 247 must be controlled to with about a tenth of a millimeter to prevent the paste bleed-out from contacting and possibly fouling the substrate contacts 218. However, the amount of paste bleed-out depends on many factors that may include the amount and type of paste, and temperature. It can be cost prohibitive to precisely control all of the variables to result in a precisely controlled amount of paste bleed-out.

In an embodiment, the connection, support assembly 215 includes at least one element that is smaller than the die 205. Accordingly, a void 250 is positioned between the die 205 and substrate 210 where the support assembly 215 is smaller than the die 205. In an embodiment, the void 250 extends around a peripheral portion of the die 205 inwardly from the peripheral portion 219 of the substrate 210. The paste bleed-out 247 extends into the void 250 but not into the substrate peripheral portion 219.

The bonding wire 212 connects one of the contacts (e.g., pads) 206 to one of the contacts 218. An encapsulant 225 covers the die 205, bonding wire 212, and peripheral portion 219 of the substrate assembly 210. The encapsulant 225 further fills the void 250. The contacts 218 are closer to the outer surface die 209 due to the paste bleeding out from the spacer 233, which has a smaller footprint than the die. That is, distance 221 is reduced as compared to conventional packages. In an embodiment, distance 221 is about 0.38 millimeter. In an embodiment, distance 221 is less than about 0.38 millimeter. In an embodiment, when the resulting package 200 includes a conventionally sized die, the package 200 has a reduced width due to the substrate assembly 210 being smaller while still accounting for the paste bleed-out, i.e. distance 220 is reduced. In an embodiment, the distance 220 is about 0.5 millimeter. In an embodiment, the distance 220 is less than about 0.5 millimeter. In an embodiment, distance 220 is less than about half conventional distances form the die peripheral surface to the encapsulant side. In an embodiment, the package 200 has a same size as a conventional package with the substrate assembly being the same size and the die 205 is enlarged. Thus, the enlarged die 205 has greater real estate for fabricating integrated circuits and the package is connectable to conventional, standard sockets.

It is desirable to provide a die 205 having essentially planar, parallel top and bottom surfaces. It is further desirable to have the top surface of the substrate 210 to be horizontal and planar. The substrate top surface is essentially parallel to the die bottom surface. Accordingly, in an embodiment, the spacer 233 and adhesive film 231 have top and bottom surfaces that are horizontal as well. These elements having essentially planar and as shown in the figures horizontal surfaces reduces the mechanical stresses in the package and reduces assembly problems.

FIG. 3 shows a plan view of the package 200. As seen in this view the die 205 has an area that covers a significant inner portion of the substrate 210. The substrate 210 includes an outer portion 219 that extends outwardly of the die. The support assembly 215 includes the adhesive layer, which is not shown as it has the same area as die 205, and the spacer 233. In an embodiment, the paste layer 207 has an initial area as it is applied to the substrate 210 that is essentially the same as the area of the spacer 233. When the spacer 233 is pressed down onto the paste layer 207 against the substrate 210 a portion 247 of the paste layer bleeds out from under the spacer 233. However, the bleed-out portion 247 does not extend the area of the paste layer 207 to be larger than the area of the die 205. Thus, the outer edge of the die 205 can be positioned closer to the edge of the package 200, i.e., edge of encapsulant 225 and substrate 210. Accordingly, distance 220 is reduced. Moreover, the distance 221 between the edge of the die 205 and substrate contacts 218 are reduces according to the teachings of the present invention.

Figure 4:
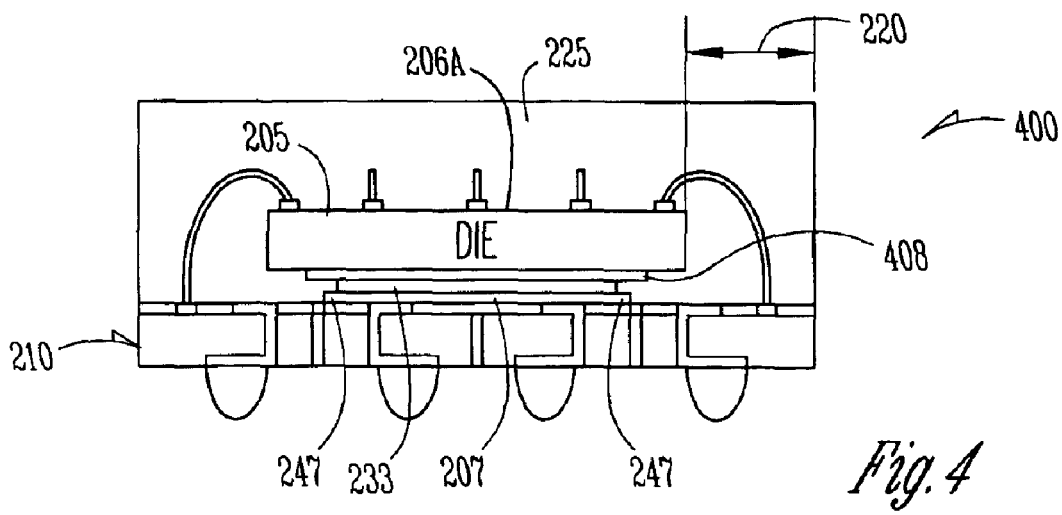
FIG. 4 is an elevational view of another embodiment of a package according to the present invention.
Figure 5:
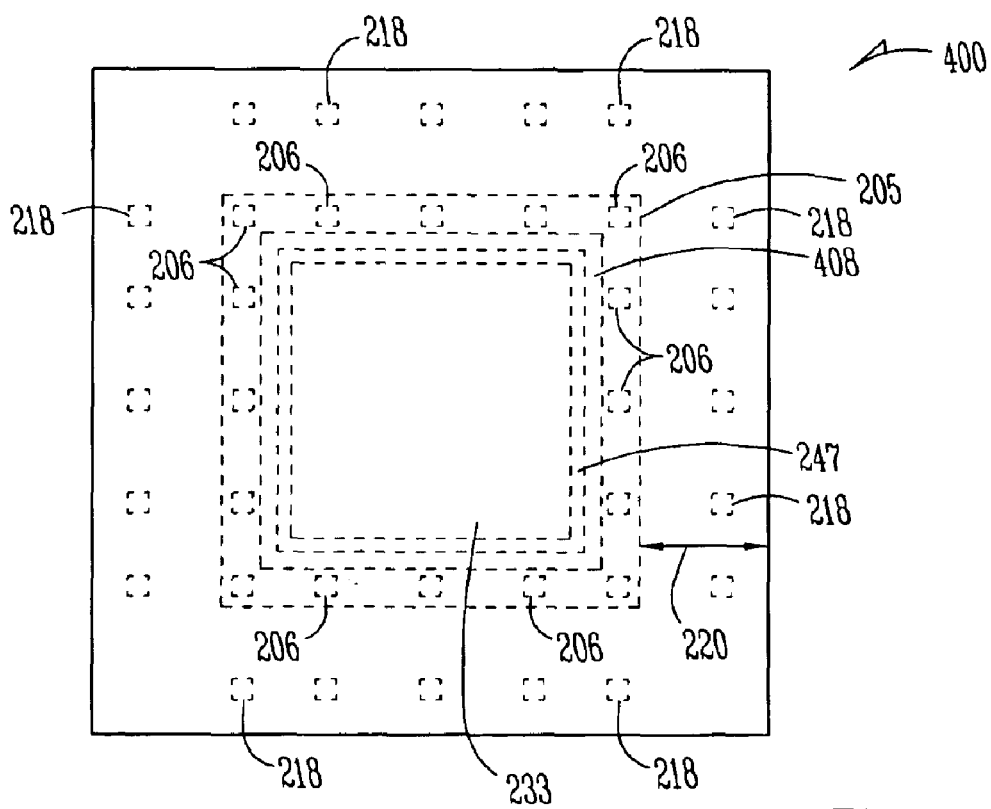
FIG. 5 is a top, plan view of package shown in FIG. 4.

FIGS. 4 and 5 show a further embodiment of a package 400 according to the teachings of the present invention. The FIGS. 4 and 5 embodiment differs from the embodiment described above in that the adhesive film 408 is recessed beneath the die 205. Accordingly, the die 205 overhangs the adhesive film 408.

Figure 6:
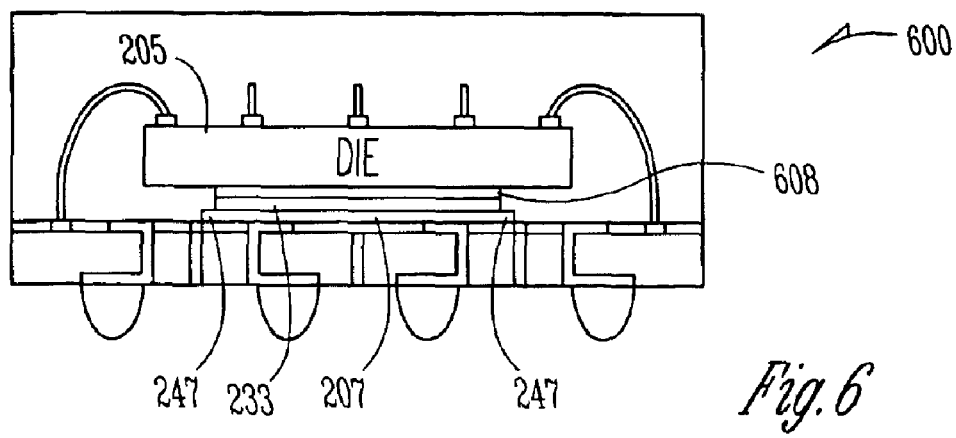
FIG. 6 is an elevational view of another embodiment of a package according to the present invention.
Figure 7:
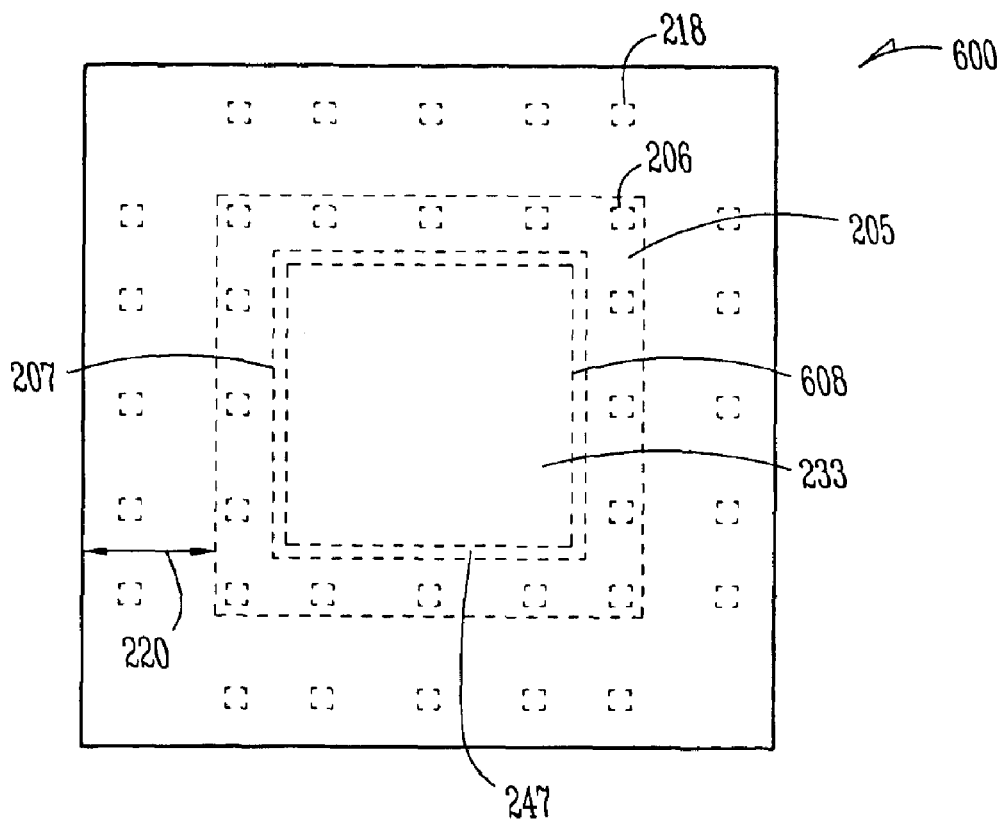
FIG. 7 is a top, plan view of package shown in FIG. 6.

FIGS. 6 and 7 show a further embodiment of a package 600 according to the teachings of the present invention. The FIGS. 6 and 7 embodiment differs from the embodiments described above in that the adhesive film 608 is recessed beneath the die 205. Accordingly, the die 205 overhangs the adhesive film 608. The adhesive film 608 has a surface area generally equal to the top surface area of the spacer 233. Accordingly, in the plan view of FIG. 7, the edge of the adhesive layer 608 is essentially the same as the edge of the spacer 233. In an embodiment, the adhesive film 608 is adhered to the spacer 233 and then adhered to the die 205.

Figure 8:
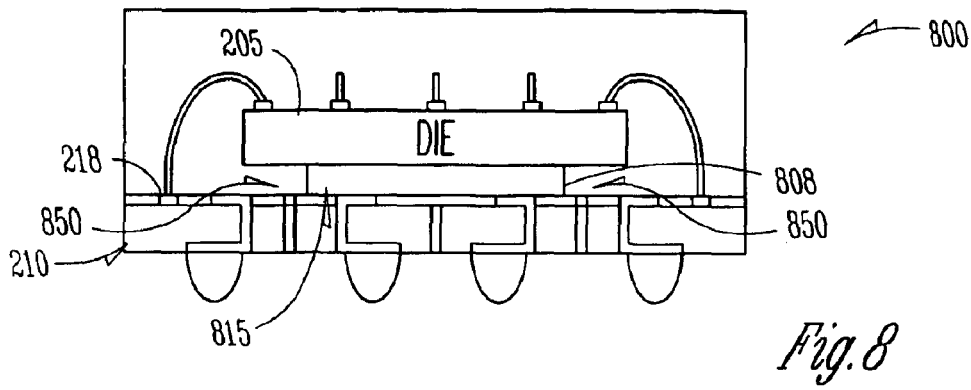
FIG. 8 is an elevational view of another embodiment of a package according to the present invention.
Figure 9:
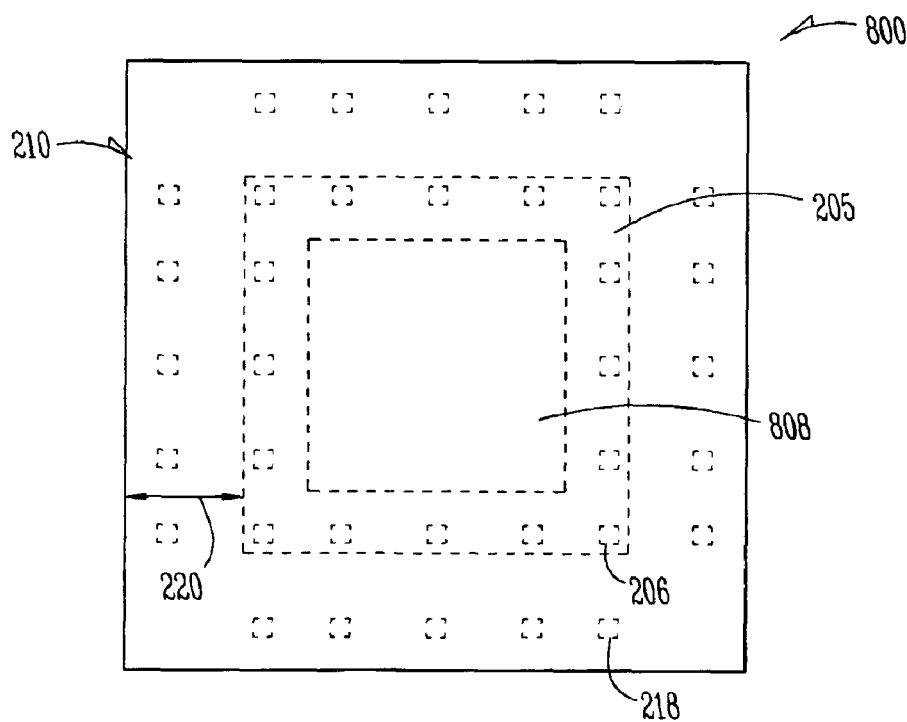
FIG. 9 is a top view of package shown in FIG. 8.

FIGS. 8 and 9 show a further embodiment of a package 800 according to the teachings of the present invention. Package 800 includes die 205 and substrate 210. A connection, support assembly 815 includes an adhesive layer 808 that adheres the die 205 to substrate 210. In an embodiment, assembly 815 only includes adhesive layer 808. Accordingly, adhesive layer 808 is in direct contact with both the die and substrate. The adhesive layer 808 is smaller than the die 205, which is smaller than the substrate 210 so that substrate contacts 218 are uncovered by either the die or the adhesive layer 808. The adhesive layer 808 covers a smaller area of the substrate 210 than the die 205 covers. Accordingly, there is a void or recess 850 between the die and substrate outwardly of the adhesive layer 808. The adhesive layer 808 has a height which elevates the die above the substrate. In an embodiment, the adhesive layer 808 is not flowable so as to not contact the contact pads 218 during or after assembly. Accordingly, in the plan view of FIG. 9, the edge of the adhesive layer 808 is inwardly spaced relative to the edge of the die 205. In an embodiment, the adhesive layer 808 is adhered to the die 205 and then adhered to the substrate 210. In another embodiment, the adhesive layer 808 is adhered to the substrate 210 and then die 205 is brought into contact with the adhesive layer. The adhesive layer 808, in an embodiment, is flowable but it applied to one of the die and substrate to cover an area less than the area of the die. Moreover, the amount of adhesive applied to create adhesive layer 808 is such that if it flows outwardly during assembly and before the encapsulant encloses the adhesive layer 808, it remains recessed under the die 205. Thus, distance 220 is reduced and the benefits as described in with regard to the present invention are achieved.

The illustrated embodiments of the present invention provide a package that has the support assembly that elevates the die 205 in the Z-axis above the substrate assembly 210. The upper surface of the substrate assembly 210 defines the X-Y plane. The support assembly in a embodiment includes a plurality of elements such as adhesive layer 231, spacer 233, and paste layer 207. The support assembly in an embodiment includes a single spacer element such as adhesive layer 808.

Circuit Modules

Figure 10:
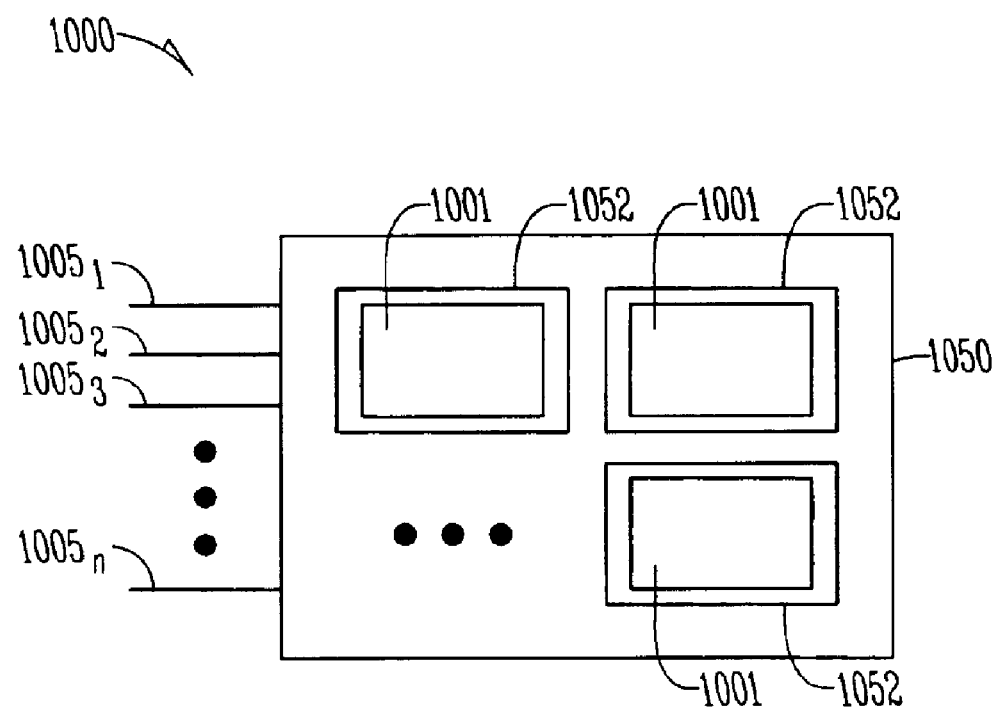
FIG. 10 is a view of a circuit module according to the teachings of the present invention.

As shown in FIG. 10, two or more packaged dies 1000 having a structure described in any of the above embodiments of the present invention may be combined, with or without protective casing, into a circuit module 1000 to enhance or extend the functionality of an individual die 1001. Circuit module 1000 maybe a combination of dies 1001 representing a variety of functions, or a combination of dies 1001 containing the same functionality. In an embodiment, circuit module 1000 includes at least one socket, slot, recess or the like 1052 into which an individual die 1001 is received. One or more dies 1001 of circuit module 1000 include I/O structures in accordance with the invention and/or are fabricated in accordance with the present invention. In an embodiment, dies 1001 are inserted into a slot 1052 in a circuit board 1050 such that the package ball contacts (e.g., contacts 217 in the FIG. 2 embodiment) are in electrical communication with the contacts in the slot 1052.

Numeral 1052 in FIG. 10, in another embodiment, represents a mount including pads whereat the contacts of a package according to the present invention are mounted. The mounting process includes a surface mount technology (SMT) process. For example, circuit module 1000 is a printed circuit board having pad patterns on which solder paste is applied, e.g., by printing the solder paste. A packaged die 1001 is picked and placed at the mount with the ball contacts (e.g., contacts 217 in the FIG. 2 embodiment) aligned with the solder paste covered pads or contacts of the mount. Either the ball contacts or the mount contacts are reflowed to create a physical and electrical connection.

Some examples of a circuit module include memory modules, device drivers, power modules, communication modems, processor modules and application-specific modules, and may include multilayer, multichip modules. Such modules will have a chip receiver in which a chip according to the present invention is inserted. Circuit module 1000 may be a subcomponent of a variety of electronic systems, such as a clock, a television, a cell phone, a personal computer, an automobile, an industrial control system, an aircraft and others. Such modules will have a circuit module receiver in which a circuit module according to the present invention is inserted. Circuit module 1000 will have a variety of leads $1005_1$ through $1005_N$ extending therefrom and coupled to the ball contacts of packaged dies 1001 providing unilateral or bilateral communication and control to and from external circuits (not shown).

Figure 11:
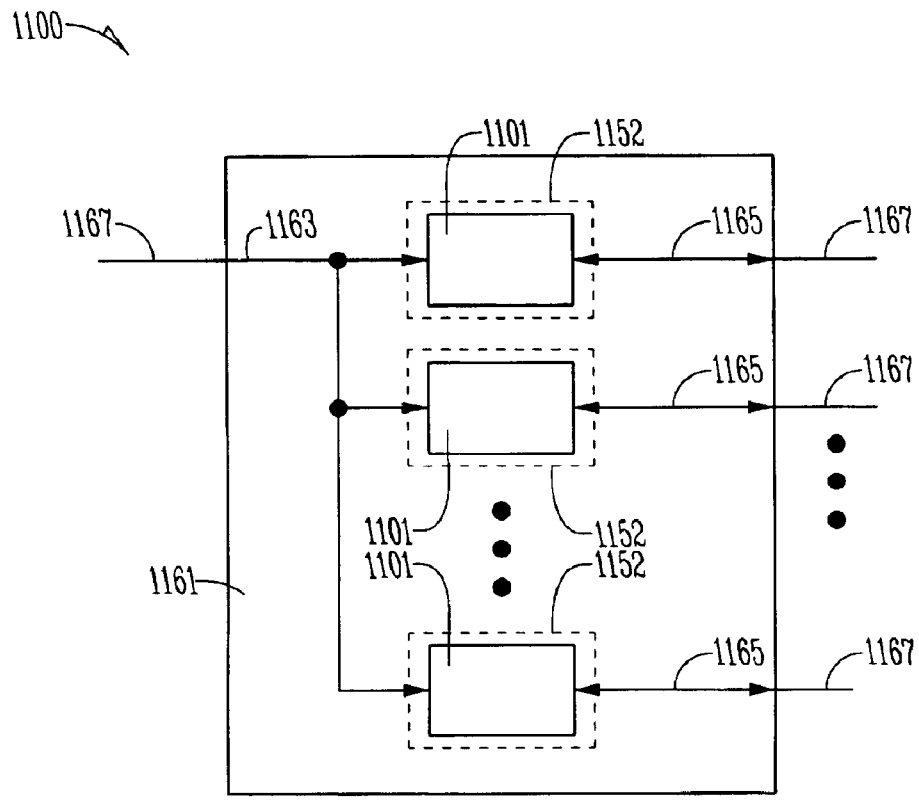
FIG. 11 is view of a memory module according to the teachings of the present invention.

FIG. 11 shows one embodiment of a circuit module as memory module 1100. Memory module 1100 contains multiple memory devices 1101 contained on support 1161. In an embodiment, support 1161 includes slots 1152 for receiving memory devices 1101. The number of memory devices generally depends upon the desired bus width and the desire for parity. Memory devices 1101 include at least one packaged die in accordance with the present invention. The support 1161 includes sockets, slots, recesses or the like 1152, each adapted to receive a memory device 1101 and provide electrical communication between a bus and memory device 1101. Memory module 1100 accepts a command signal from an external controller (not shown) on a command link 1163 and provides for data input and data output on data links 1165. The command link 1163 and data links 1165 are connected to leads 1167 extending from the support 1161. Leads 1167 are shown for conceptual purposes and are not limited to the positions shown in FIG. 11.

Electronic Systems

Figure 12:
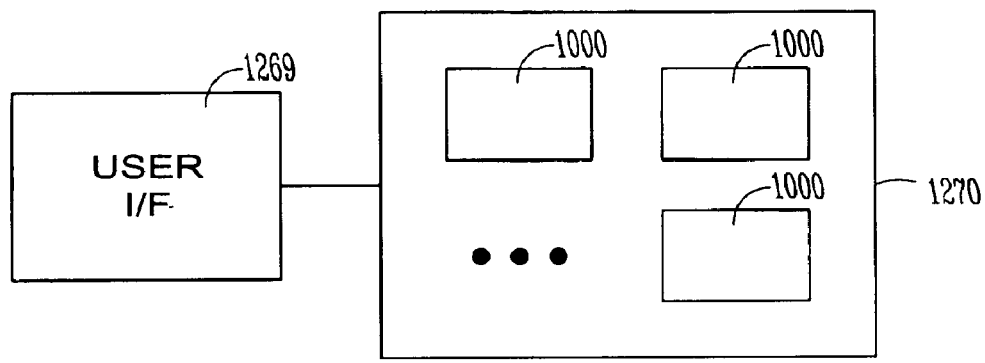
FIG. 12 is a view of an electronic system according to the teachings of the present invention.

FIG. 12 shows one embodiment of an electronic system 1200 containing one or more circuit modules 1000. At least one of the circuit modules 1000 contains a packaged die in accordance with the present invention. Electronic system 1200 generally contains a user interface 1269 and electronic device 1270. User interface 1269 provides a user of the electronic system 1200 with some form of control or observation of the results of the electronic device 1270. Some examples of user interface 1269 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 1269 may further describe access ports provided to electronic device 1270. Access ports are used to connect an electronic system to the more tangible user interface components previously exemplified. One or more of the circuit modules 1000 may be a processor providing some form of manipulation, control or direction of inputs from or outputs to user interface 1269, or of other information either preprogrammed into, or otherwise provided to, electronic system 1200. In an embodiment, electronic device 1200 includes memory modules 1000. As will be apparent from the lists of examples previously given, electronic system 1200 will often be associated with certain mechanical components (not shown) in addition to circuit modules 1000 and user interface 1269. It will be appreciated that the one or more circuit modules 1000 in electronic system 1200 can be replaced by a single integrated circuit. Furthermore, electronic system 1200 may be a subcomponent of a larger electronic system.

Figure 13:
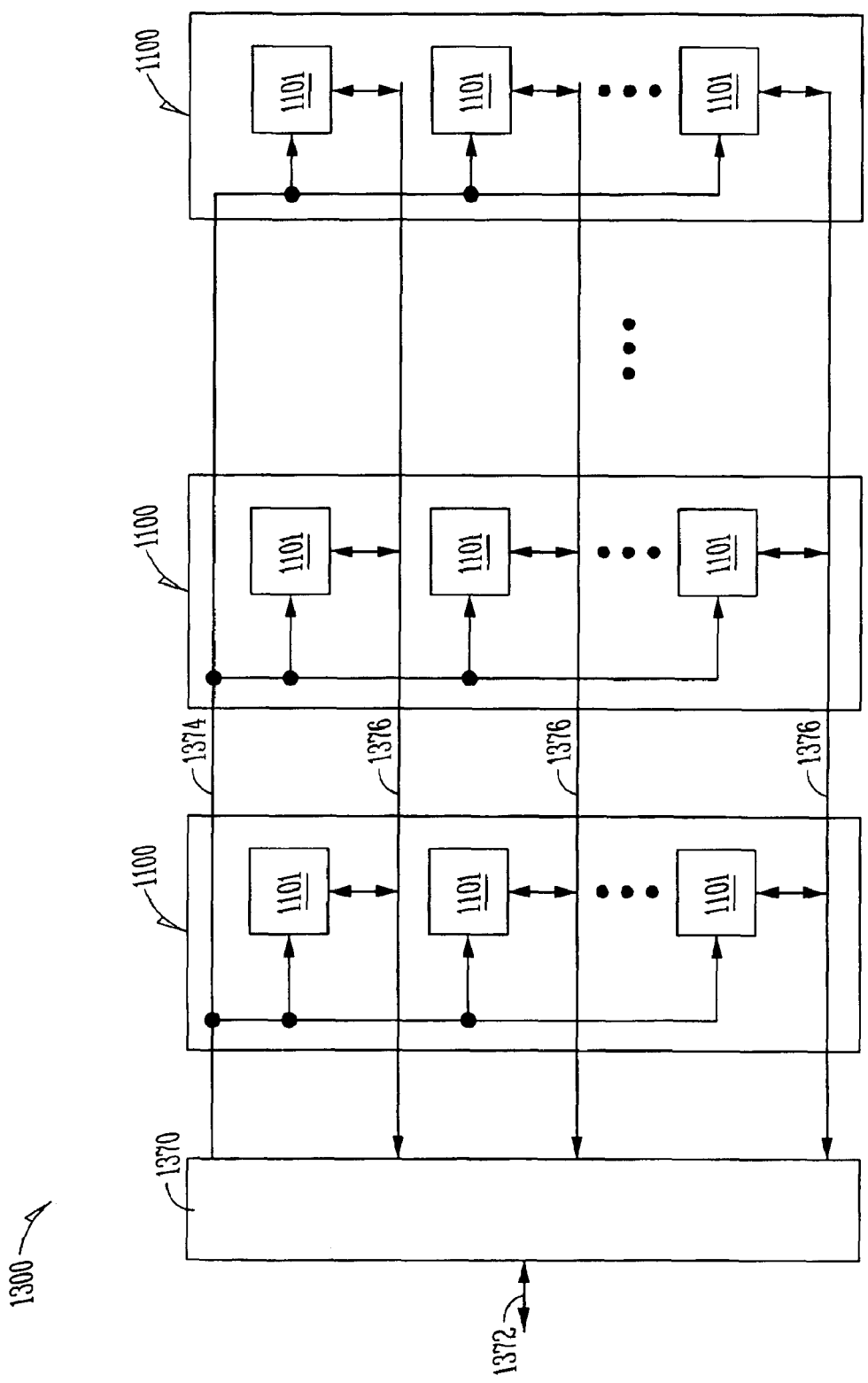
FIG. 13 is a view of an embodiment of an electronic system according to the teachings of the present invention.

FIG. 13 shows one embodiment of an electronic system as memory system 1300. Memory system 1300 contains one or more memory modules 1100 and a memory controller 1370.

At least one of the memory modules 1100 includes a die package 1101 in accordance with the present invention. Memory controller 1370 provides and controls a bidirectional interface between memory system 1300 and an external system bus 1372. Memory system 1300 accepts a command signal from the external bus 1372 and relays it to the one or more memory modules 1100 on a command link 1374. Memory system 1300 provides for data input and data output between the one or more memory modules 1100 and external system bus 1372 on data links 1376.

Figure 14:
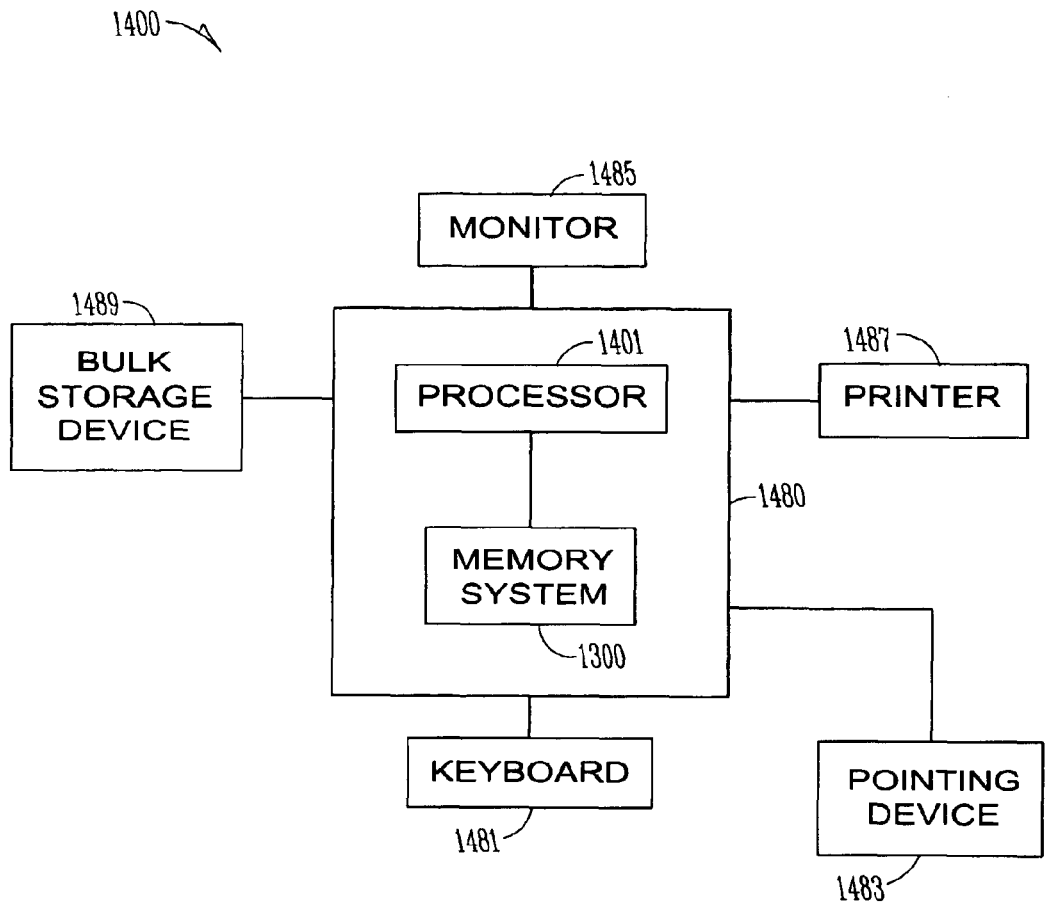
FIG. 14 is a view of a computer system according to the teachings of the present invention.

FIG. 14 shows a further embodiment of an electronic system as a computer system 1400. Computer system 1400 contains a processor 1401 and a memory system, such as memory system 1300 as shown in FIG. 13, housed in a computer unit 1480. In an embodiment, the memory system 1300 includes a packaged die in accordance with the present invention. In an embodiment, processor 1401 includes a packaged die in accordance with the present invention. Computer system 1400 is but one example of an electronic system containing another electronic system, i.e., memory system 1300, as a subcomponent. Computer system 1400 optionally contains user interface components. Depicted in FIG. 14 are a keyboard 1481, a pointing device 1483 such as a mouse, trackball, or joystick, a monitor 1485, a printer 1487 and a bulk storage device 1489. It will be appreciated that other components are often associated with computer system 1400 such as modems, device driver cards, additional storage devices, etc. These other components, in an embodiment, include a packaged die in accordance with the present invention. It will further be appreciated that the processor 1401 and memory system 1000 of computer system 1400 can be incorporated on a single integrated circuit to form a single memory/processing package. Such single package processing units reduce the communication time between the processor and the memory circuit.

It will be understood that the teachings of the present invention can be used to form full ball grid array packages, fine ball grid array packages, and partial ball grid array packages. In an embodiment, the teachings of the present invention are adaptable for use with a NuBGA.

Conclusion

It is desired to reduce the size of packaged electronic components. This results in packaging material savings and increases throughput by reducing packaging times. Moreover, with the growing popularity of smaller electronic device the electronic components must be as small as possible. The present invention further provides methods for producing a packaged die and packaged die structures. The amount of encapsulant material extending outwardly around the periphery of the die is reduced. Accordingly, the present invention provides a profile package having reduced length and width. An embodiment of the present invention provides a reduced size chip on board, ball grid array package. Moreover, by reducing the amount of encapsulant a larger die can be packaged and still have a package size that is equal to conventional package sizes. A larger die is desirable in the field of integrated circuits as it increases the real estate available for integrated circuits. The reduced width of encapsulant may also improve the heat transfer from the die to the environment as the heat is transferred through less encapsulant.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other integrated circuit processing equipment may be utilized in conjunction with the invention. For another example, other integrated circuit fabrication processes are adapted to produce the dies and chips according to the present invention. Accordingly, this application is intended to cover any adaptations or variations of the invention. It is manifestly intended that this invention be limited only by the following claims and equivalents thereof.

What is claimed is:

1. A chip on board package, comprising:
   a ball grid array substrate;
   a die spaced from the substrate;
   a wire bond electrically connecting the die to the substrate; and
   a void extending intermediate the die and the substrate.

2. The package of claim 1, wherein the substrate includes a support elevating the die above the substrate to create the void.

3. The package of claim 1, wherein the substrate includes an adhesive layer in contact with the die, a spacer, and a paste layer, and wherein the void is inwardly bound by the adhesive layer, the spacer and the paste layer.

4. The package of claim 1, wherein the void extends under one side of the die.

5. The package of claim 1, wherein the void extends under the periphery the die.

6. The package of claim 1, wherein the void extends under an outer portion the die.

7. The package of claim 1, wherein the void is a recess.

8. A chip on board package, comprising:
   a ball grid array substrate;
   a die;
   a support connecting the die to the substrate;
   a wire bond electrically connecting the die to the substrate; and
   a void extending intermediate the die and the substrate.

9. The package of claim 8, wherein the support is inwardly spaced from a periphery of the die, the support forming a closed end of the void.

10. The package of claim 8, wherein the die includes a first dimension, the support includes a paste layer that has an initial, non-bleed out dimension and an assembled, bleed out dimension, the non-bleed out dimension existing before the die and substrate are joined, the bleed out dimension occurring after the die and substrate are joined, both the non-bleed out dimension and the bleed out dimension being less than the first dimension, and the bleed out dimension extending into the void.

11. The package of claim 10, wherein the support includes a spacer having a second dimension that is less than the first dimension.

12. The package of claim 11, wherein the second dimension is less than the bleed out dimension.

13. The package of claim 12, wherein an encapsulant is in the void.

14. The package of claim 12, wherein the encapsulant fills the void.

15. A chip on board package, comprising:
    a ball grid array substrate;
    a die having a bottom surface;
    an adhesive layer on the bottom surface;
    a support connecting the adhesive layer to the substrate;
    a wire bond electrically connecting the die to the substrate; and
    a void extending intermediate the die and the substrate.

16. The package of claim 15, wherein the support is inwardly spaced from a periphery of the die, the support forming a closed end of the void.

17. The package of claim 15, wherein the die includes a first dimension, and the support includes a paste layer that has a non-bleed out dimension and a bleed out dimension, both the non-bleed out dimension and the bleed out dimension are less than the first dimension.

18. The package of claim 17, wherein the bleed out dimension defines an area of the paste layer, the area of the paste layer is less than an area of the bottom surface.

19. The package of claim 15, wherein the support includes a spacer having a second dimension that is less than the first dimension.

20. The package of claim 19, wherein the second dimension is less than the bleed out dimension.

21. The package of claim 15, wherein an encapsulant is in the void.

22. The package of claim 15, wherein the encapsulant fills the void.

23. The package of claim 15, wherein the adhesive layer has an adhesive layer surface area, and the support includes a paste layer that has a bleed out area the bleed out area is less than the adhesive surface area.

24. A chip on board package, comprising:
   a ball grid array substrate having a first substrate surface with at least one first contact;
   a die having a first die surface with at least one second contact;
   a support connecting the die to the substrate, the support being inwardly spaced from the at least one first contact;
   at least one wire bond electrically connecting the at least one first contact to the at least one second contact; and
   a void extending intermediate the die and the substrate.

25. The package of claim 24, wherein the support includes a spacer, and an adhesive layer connected to a second die surface and the spacer.

26. The package of claim 25, wherein the spacer and the support are positioned inwardly of the at least one first contact.

27. The package of claim 26, wherein the support includes a paste layer intermediate the spacer and the first substrate surface.

28. The package of claim 24, wherein the substrate includes a second substrate surface and at least one ball contact on the second substrate surface.

29. A chip on board package, comprising:
   a substrate having a first substrate surface with at least one first contact and a second substrate surface with at least one second contact;
   a die having a first die surface with at least one third contact;
   a support connecting the die to the substrate, the support being inwardly spaced from the at least one first contact;
   at least one wire bond electrically connecting the at least one first contact to the at least one third contact; and
   a void extending intermediate the die and the substrate and outwardly of the support.

30. The package of claim 29, wherein the void extends around the periphery of the support.

31. The package of claim 29, wherein the support includes an adhesive layer connected to a second die surface of the die.

32. The package of claim 31, wherein the adhesive layer is connected to the first substrate surface.

* * * * *